US011047922B2

(12) United States Patent
Morimoto et al.

(10) Patent No.: US 11,047,922 B2
(45) Date of Patent: Jun. 29, 2021

(54) ABNORMALITY DETECTION DEVICE

(71) Applicant: Yazaki Corporation, Tokyo (JP)

(72) Inventors: Mitsuaki Morimoto, Shizuoka (JP);
Eiichiro Oishi, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 37 days.

(21) Appl. No.: 16/788,538

(22) Filed: Feb. 12, 2020

(65) Prior Publication Data
US 2020/0182946 A1 Jun. 11, 2020

Related U.S. Application Data

(63) Continuation of application No. PCT/JP2018/019649, filed on May 22, 2018.

(30) Foreign Application Priority Data

Sep. 15, 2017 (JP) .............................. JP2017-177802

(51) Int. Cl.
*G01R 31/52* (2020.01)
*G01R 31/54* (2020.01)

(52) U.S. Cl.
CPC .............. *G01R 31/52* (2020.01); *G01R 31/54* (2020.01)

(58) Field of Classification Search
CPC ................................................ G01R 31/50–55
See application file for complete search history.

(56) References Cited

U.S. PATENT DOCUMENTS

| 3,818,330 | A | * | 6/1974 | Hiroshima | ......... | G01R 31/2836 |
| | | | | | | 324/549 |
| 4,639,611 | A | * | 1/1987 | Sticher | .................... | G01R 31/50 |
| | | | | | | 307/117 |
| 5,457,391 | A | * | 10/1995 | Shimizu | ................. | G01R 31/52 |
| | | | | | | 324/546 |
| 6,331,941 | B1 | * | 12/2001 | Smith | ..................... | G01R 31/52 |
| | | | | | | 363/37 |
| 6,489,779 | B1 | * | 12/2002 | Tucker | ................... | G11B 5/022 |
| | | | | | | 324/522 |
| 2009/0109588 | A1 | * | 4/2009 | Hayama | ................. | G01R 31/58 |
| | | | | | | 361/93.1 |

(Continued)

FOREIGN PATENT DOCUMENTS

JP 2013-250258 A 12/2013

*Primary Examiner* — Patrick Assouad
*Assistant Examiner* — Demetrius R Pretlow
(74) *Attorney, Agent, or Firm* — Sughrue Mion, PLLC (57) ABSTRACT

In a bridge circuit, a series circuit in which a first resistor and a second resistor are connected in series and the second resistor and a fourth resistor are connected in series is formed. In the bridge circuit, the series circuit is connected to a load portion in parallel, one end of a fifth resistor is connected between the second resistor and the fourth resistor, and the other end of the fifth resistor is connected between the first resistor and the load portion. In the bridge circuit, a voltage supply unit is connected between the first resistor and the second resistor. A controller detects an abnormality of the load portion based on a detection voltage of the bridge circuit detected by applying a voltage from the voltage supply unit with a switch turned off. With this configuration, an abnormality detection device can detect abnormality while suppressing an increase in size.

2 Claims, 6 Drawing Sheets

(56) References Cited

U.S. PATENT DOCUMENTS

| | | | |
|---|---|---|---|
| 2013/0093432 A1* | 4/2013 | Matsumoto | G01R 31/2829 324/537 |
| 2014/0104734 A1* | 4/2014 | Prisse | H02H 9/041 361/79 |
| 2015/0162747 A1* | 6/2015 | Iwasaki | H02H 9/02 361/90 |
| 2015/0331032 A1* | 11/2015 | Fischer | H02P 27/08 318/519 |
| 2015/0346276 A1* | 12/2015 | Liu | G01R 31/2884 324/750.3 |
| 2016/0047852 A1* | 2/2016 | Poisson | G01R 31/52 324/522 |
| 2016/0131718 A1* | 5/2016 | Sugimura | G01R 31/52 324/426 |
| 2016/0255318 A1* | 9/2016 | Chevallaz | H03K 5/24 348/205 |
| 2016/0377670 A1* | 12/2016 | Tamida | G01R 31/52 324/551 |
| 2017/0012530 A1* | 1/2017 | Pasqualetto | H02H 7/0833 |
| 2017/0205458 A1* | 7/2017 | Kurooka | H03F 3/45071 |
| 2017/0272024 A1* | 9/2017 | Mastrocola | H02P 29/027 |
| 2017/0276715 A1* | 9/2017 | Heinz | G01R 31/42 |
| 2017/0322250 A1* | 11/2017 | Tornare | B60L 3/0069 |
| 2019/0077450 A1* | 3/2019 | Sasaki | B62D 5/0403 |
| 2020/0023741 A1* | 1/2020 | Jin | H01H 47/002 |
| 2020/0025816 A1* | 1/2020 | Zondler | G01R 31/52 |
| 2020/0041557 A1* | 2/2020 | Pradelles | G01R 1/0416 |
| 2020/0177003 A1* | 6/2020 | Miklis | B60L 58/10 |

\* cited by examiner

ABNORMALITY DETECTION DEVICE

CROSS-REFERENCE TO RELATED APPLICATION

This application is a continuation application of International Application PCT/JP2018/019649, filed on May 22, 2018 which claims the benefit of priority from Japanese Patent application No. 2017-177802 filed on Sep. 15, 2017 and designating the U.S., the entire contents of which are incorporated herein by reference.

BACKGROUND OF THE INVENTION

1. Field of the Invention

The present invention relates to an abnormality detection device.

2. Description of the Related Art

Conventionally, a vehicle has been equipped with a voltage detection device that detects the voltage of a main power source that supplies electric power to a load portion. Furthermore, on the vehicle, installed may be an abnormality detection device that detects an abnormality such as a short circuit of the load portion, before the electric power is supplied to the load portion from the main power source (for example, Japanese Patent Application Laid-open No. 2013-250258).

Incidentally, in a conventional abnormality detection device, because a dedicated electronic component for detecting an abnormality such as a short circuit of the load portion is needed, it tends to increase in size, and in this regard, there is room for further improvement.

SUMMARY OF THE INVENTION

Thus, the present invention has been made in view of the foregoing, and an object of the present invention is to provide an abnormality detection device capable of suppressing an increase in size.

In order to solve the above mentioned problem and achieve the object, an abnormality detection device according to one aspect of the present invention includes an abnormality detection target connected to a main power source and is supplied with electric power from the main power source; a bridge circuit including a first resistor, a second resistor, a third resistor that is the abnormality detection target, a fourth resistor, and a fifth resistor; a voltage supply unit being a power source different from the main power source and configured to apply a voltage to the bridge circuit; and a controller configured to control the main power source and the voltage supply unit, wherein in the bridge circuit, a series circuit in which the first resistor and the second resistor are connected in series and in which the second resistor and the fourth resistor are connected in series is formed, the series circuit is connected to the third resistor in parallel, one end of the fifth resistor is connected between the second resistor and the fourth resistor, and the other end of the fifth resistor is connected between the first resistor and the third resistor, and the voltage supply unit is connected between the first resistor and the second resistor, and the controller is configured to detect an abnormality of the third resistor on a basis of a detection voltage of the bridge circuit detected by applying the voltage from the voltage supply unit in a state where the main power source is turned off.

According to another aspect of the present invention, in the abnormality detection device, it is preferable that the controller is configured to detect a short circuit of the third resistor on a basis of the detection voltage and a short-circuit reference voltage indicating that the third resistor has short-circuited, and detect an open circuit of the third resistor on a basis of the detection voltage and an open-circuit reference voltage indicating that the third resistor has been open.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

With reference to the accompanying drawings, a form to implement the present invention (an exemplary embodiment) will be described in detail. The present invention is not intended to be limited by the content described in the following embodiment. Furthermore, the constituent elements described in the following include elements easily achieved by a person skilled in the art or elements being substantially the same as the constituent elements. Moreover, the configurations described in the following can be combined as appropriate. Furthermore, various omissions, substitutions, or modifications of the configurations can be made without departing from the scope of the present invention.

Embodiment

Figure 1:
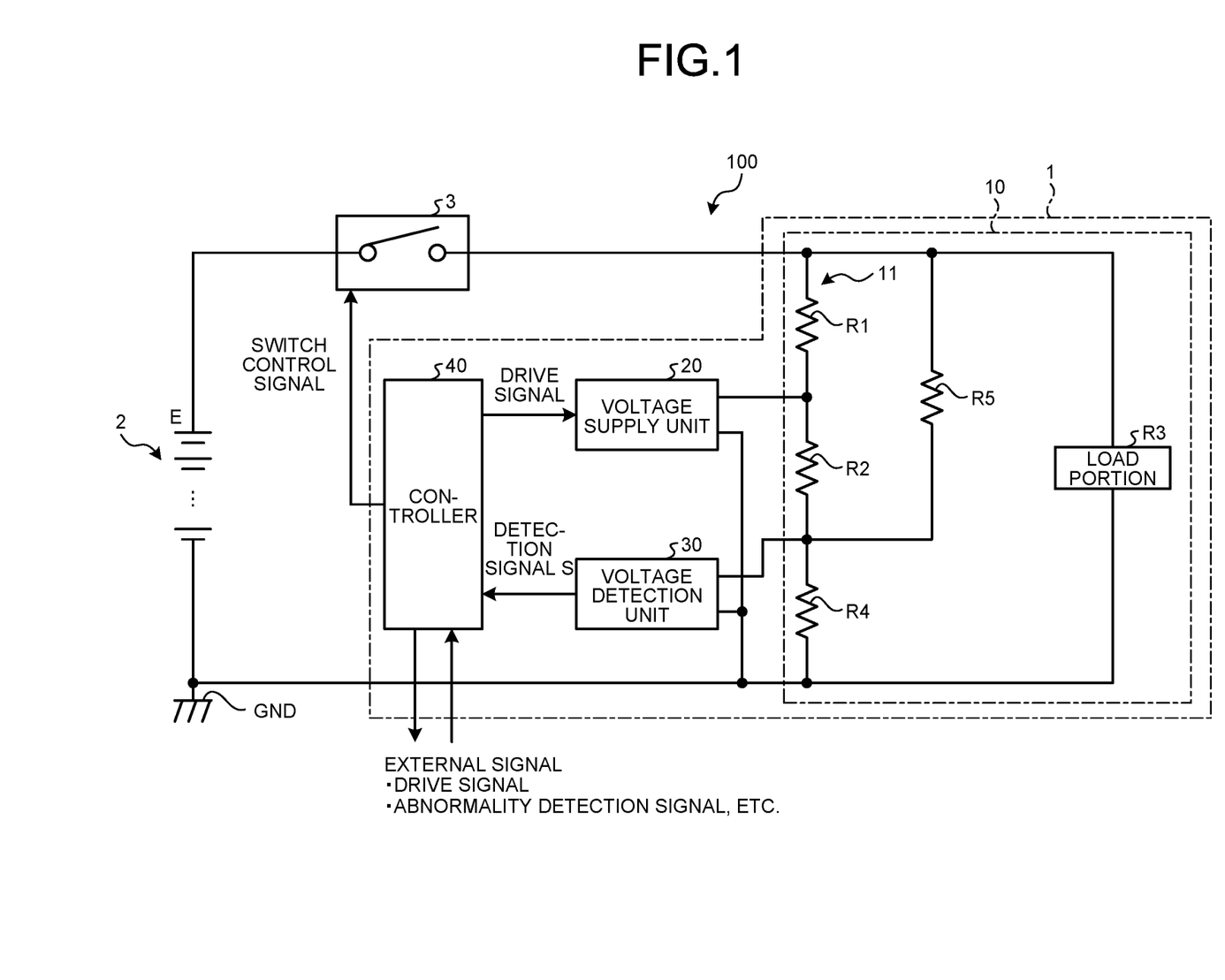
FIG. 1 is a circuit diagram illustrating a configuration example of an abnormality detection device according to an embodiment.

An abnormality detection device 1 according to an embodiment will be described. The abnormality detection device 1 is a device that detects an abnormality of a load portion R3. The abnormality detection device 1 is incorporated in a vehicle-power supply control system 100 that controls a battery 2 as a main power source of a vehicle. The vehicle-power supply control system 100 is a system that controls the electric power supplied to the load portion R3 from the battery 2. The vehicle-power supply control system 100, as illustrated in FIG. 1, includes the battery 2, a switch 3, the load portion R3, and the abnormality detection device 1.

The battery 2 supplies the electric power to the load portion R3. The battery 2 is a secondary battery capable of storing electric power and is connected to the load portion R3 via the switch 3. The battery 2 supplies the electric power of voltage E to the load portion R3.

The switch 3 is a circuit that supplies or interrupts electric current that flows to the load portion R3 from the battery 2. The switch 3 is provided between a positive electrode of the battery 2 and the load portion R3. The switch 3 is connected to a controller 40 of the abnormality detection device 1 described later, and is turned on and off based on a switch control signal output from the controller 40. The switch 3 is turned on when the switch control signal is a switch-on signal for turning on the switch 3, and electrically connects the battery 2 and the load portion R3. Furthermore, the switch 3 is turned off when the switch control signal is a switch-off signal for turning off the switch 3, and disconnects the battery 2 and the load portion R3.

The load portion R3 consumes the electric power supplied from the battery 2 and is a motor for driving the vehicle or the like, for example.

The abnormality detection device 1 is a device that detects an abnormality such as a short circuit of the load portion R3. The abnormality detection device 1 includes a bridge circuit 10, a voltage supply unit 20, a voltage detection unit 30, and the controller 40. The bridge circuit 10 includes a resistor R1 as a first resistor, a resistor R2 as a second resistor, the load portion R3 as a third resistor, a resistor R4 as a fourth resistor, and a resistor R5 as a fifth resistor. The load portion R3, as in the foregoing, is connected to the battery 2 and is supplied with the electric power from the battery 2. The load portion R3 is an abnormality detection target for which an abnormality in electrical connection is detected, and an abnormality such as a short circuit and an open circuit is detected, for example. In the bridge circuit 10, a series circuit 11 in which the resistor R1 and the resistor R2 are connected in series and the resistor R2 and the resistor R4 are connected in series is formed. In the bridge circuit 10, the series circuit 11 is connected to the load portion R3 in parallel. In the bridge circuit 10, one end of the resistor R5 is connected between the resistor R2 and the resistor R4, and the other end of the resistor R5 is connected between the resistor R1 and the load portion R3. Furthermore, in the bridge circuit 10, the voltage supply unit 20 is connected between the resistor R1 and the resistor R2. In the bridge circuit 10, a connection point of the load portion R3 and the resistor R4 is connected to a GND.

Figure 2:
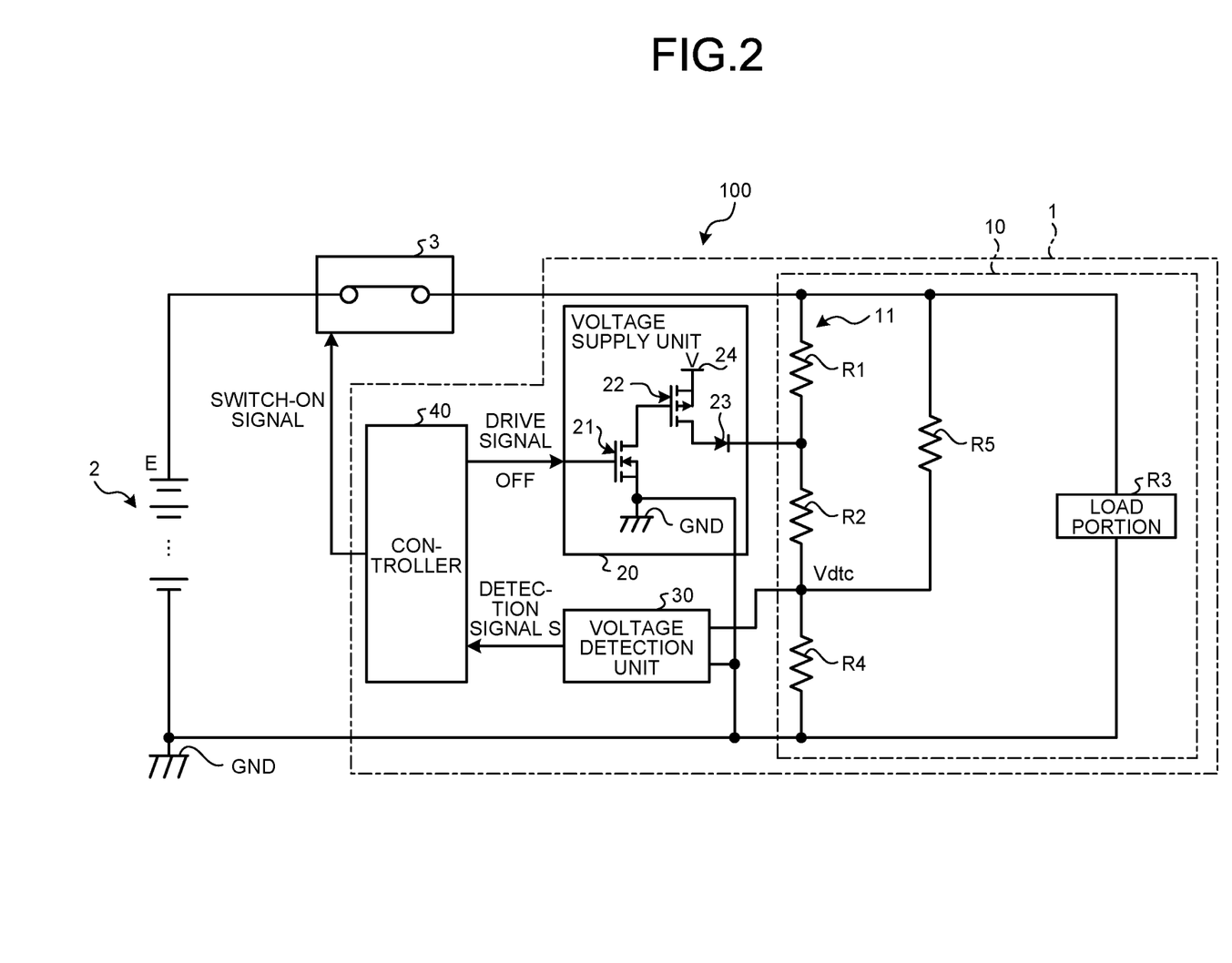
FIG. 2 is a circuit diagram illustrating an operation example of the abnormality detection device in the embodiment.

The voltage supply unit 20 is a power source different from the battery 2 and is the power source configured to apply a voltage V to the bridge circuit 10. The voltage supply unit 20, as illustrated in FIG. 2, includes a FET 21 that is an N-type channel metal oxide semiconductor field-effect transistor (MOSFET), a FET 22 that is a P-type channel MOSFET, a diode 23, and a sub-power supply 24. The FET 21 has a gate terminal connected to the controller 40, a drain terminal connected to a gate terminal of the FET 22, and a source terminal connected to the GND. The FET 22 has the gate terminal connected to the drain terminal of the FET 21, a source terminal connected to the sub-power supply 24, and a drain terminal connected to the diode 23. The diode 23 has an anode terminal connected to the drain terminal of the FET 22 and a cathode terminal connected between the resistor R1 and the resistor R2.

In the voltage supply unit 20, when a drive signal (ON) is output from the controller 40 and the voltage V is applied to the gate terminal of the FET 21, the FET 21 is turned on and an electric current flows from the drain terminal of the FET 21 to the source terminal. In the voltage supply unit 20, when the electric current flows from the drain terminal of the FET 21 to the source terminal, the voltage of the gate terminal of the FET 22 is lowered relative to the voltage of the source terminal and the FET 22 is turned on. In the voltage supply unit 20, when the FET 22 is turned on, an electric current flows from the sub-power supply 24 to the bridge circuit 10 via the diode 23. That is, the voltage supply unit 20 applies the voltage V to the bridge circuit 10. Meanwhile, in the voltage supply unit 20, when a drive signal (OFF) is output from the controller 40 and the voltage of the gate terminal of the FET 21 is lowered, the FET 21 is turned off and no electric current flows from the drain terminal to the source terminal of the FET 21. In the voltage supply unit 20, when no electric current flows from the drain terminal to the source terminal of the FET 21, the voltage of the gate terminal of the FET 22 becomes equal with the voltage of the source terminal and the FET 22 is turned off. In the voltage supply unit 20, when the FET 22 is turned off, no electric current flows from the sub-power supply 24 to the bridge circuit 10 via the diode 23. That is, the voltage supply unit 20 halts the voltage V applied to the bridge circuit 10.

The voltage detection unit 30 is a circuit that detects a voltage. The voltage detection unit 30 is connected to the resistor R4 in parallel, for example. The voltage detection unit 30 is further connected to the controller 40. The voltage detection unit 30 outputs a detection signal S (S1 to S4) indicating a detected detection voltage Vdtc to the controller 40. For example, when the switch 3 is turned on and the electric power is supplied to the load portion R3 from the battery 2, that is, in normal operation, the voltage detection unit 30 detects a divided voltage value between the resistor R4 and the combined resistance of the resistor R1, the resistor R2, and the resistor R5, as the detection voltage Vdtc in normal operation. The detection voltage Vdtc in normal operation has a voltage value defined by the following Expression 1. R1, R2, R4, and R5 described in Expression 1 have respective resistance values of the resistor R1, the resistor R2, the resistor R4, and the resistor R5, and E described in Expression 1 is a voltage value of the battery 2. The voltage detection unit 30 outputs the detection signal S1 indicating the detection voltage Vdtc in normal operation to the controller 40.

Detection Voltage in Normal Operation:

$$Vdtc = \frac{R4}{\frac{(R1+R2)\cdot R5}{(R1+R2)+R5}+R4}\cdot E = \frac{R1\cdot R4+R2\cdot R4+R4\cdot R5}{R1\cdot R4+R1\cdot R5+R2\cdot R4+R2\cdot R5+R4\cdot R5}\cdot E \quad \text{[Mathematical 1]}$$

Figure 4:
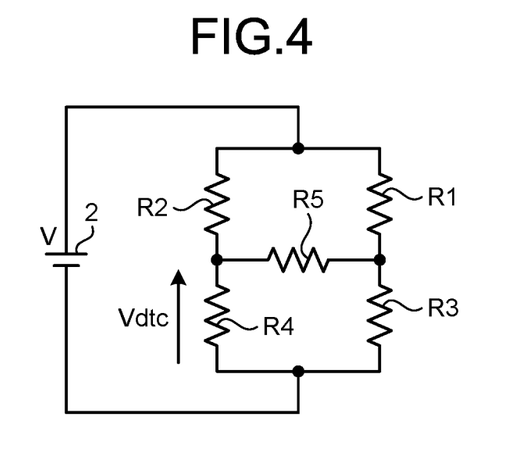
FIG. 4 is a schematic diagram illustrating a configuration example of a bridge circuit in the embodiment.

Furthermore, in a case where the electrical connection of the load portion R3 is normal when the switch 3 is turned off and the voltage V is applied to the bridge circuit 10 from the voltage supply unit 20, that is, when it is normal in an abnormality detection operation, the voltage detection unit 30 detects the detection voltage Vdtc in the abnormality detection operation from the bridge circuit 10 (see FIG. 4).

The detection voltage Vdtc in the abnormality detection operation is a voltage value defined by the following Expression 2. R1 to R5 described in Expression 2 have respective resistance values of the resistor R1 to the resistor R5, and V described in Expression 2 has a voltage value of the voltage supply unit 20. The voltage detection unit 30 outputs the detection signal S2 indicating the detection voltage Vdtc in the abnormality detection operation to the controller 40.

Detection Voltage in Abnormality Detection Operation:

$$Vdtc = \frac{R1 \cdot R3 \cdot R4 + R1 \cdot R4 \cdot R5 + R2 \cdot R3 \cdot R4 + R3 \cdot R4 \cdot R5}{R1 \cdot R2 \cdot R3 + R2 \cdot R3 \cdot R5 + R1 \cdot R3 \cdot R4 + R2 \cdot R3 \cdot R4 + R3 \cdot R4 \cdot R5 + R1 \cdot R2 \cdot R4 + R1 \cdot R2 \cdot R2 \cdot R5 + R1 \cdot R4 \cdot R5} \cdot V \quad \text{[Mathematical 2]}$$

Figure 5:
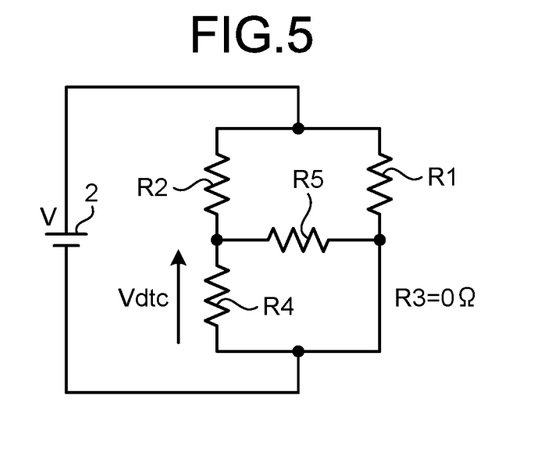
FIG. 5 is a schematic diagram illustrating the time of occurrence of a short circuit in the bridge circuit in the embodiment.

Furthermore, when the load portion R3 is short-circuited in the abnormality detection operation, that is, when the resistance of the load portion R3 is 0Ω, the voltage detection unit 30 detects the detection voltage Vdtc in short circuit detection from the bridge circuit 10 (see FIG. 5). The detection voltage Vdtc in short circuit detection has a voltage value defined by the following Expression 3. R1, R2, R4, and R5 described in Expression 3 have respective resistance values of the resistor R1, the resistor R2, the resistor R4, and the resistor R5, and V described in Expression 3 has the voltage value of the voltage supply unit 20. The voltage detection unit 30 outputs the detection signal S3 indicating the detection voltage Vdtc in short circuit detection to the controller 40.

$$Vdtc(\text{short}) = \frac{R1 \cdot R4 \cdot R5}{R1 \cdot R2 \cdot R4 + R1 \cdot R2 \cdot R5 + R1 \cdot R4 \cdot R5} \cdot V \quad \text{[Mathematical 3]}$$

Figure 6:
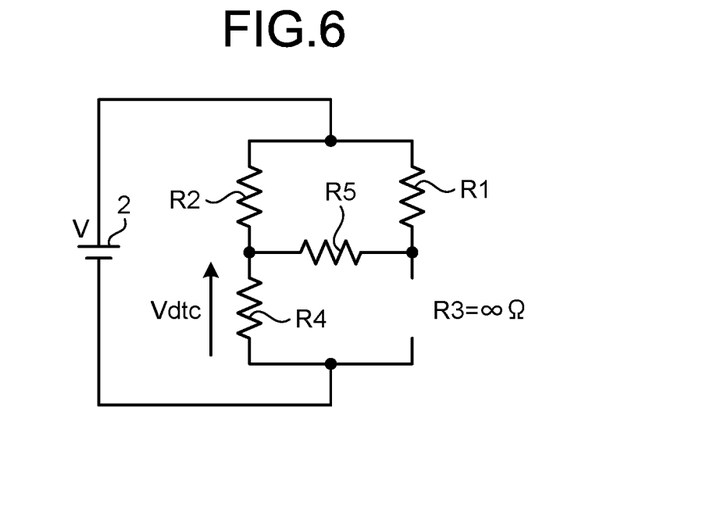
FIG. 6 is a schematic diagram illustrating the time of occurrence of an open circuit in the bridge circuit in the embodiment.

Furthermore, when the load portion R3 is open in the abnormality detection operation, that is, when the resistance of the load portion R3 is ∞Ω, the voltage detection unit 30 detects the detection voltage Vdtc in open circuit detection from the bridge circuit 10 (see FIG. 6). The detection voltage Vdtc in open circuit detection has a voltage value defined by the following Expression 4. R1, R2, R4, and R5 described in Expression 4 have respective resistance values of the resistor R1, the resistor R2, the resistor R4, and the resistor R5, and V described in Expression 4 has the voltage value of the voltage supply unit 20. The voltage detection unit 30 outputs the detection signal S4 indicating the detection voltage Vdtc in open circuit detection to the controller 40.

$$Vdtc(\text{open}) = \frac{R1 \cdot R4 + R2 \cdot R4 + R4 \cdot R5}{R1 \cdot R2 + R1 \cdot R4 + R2 \cdot R4 + R2 \cdot R5 + R4 \cdot R5} \cdot V \quad \text{[Mathematical 4]}$$

The controller 40 is a circuit that controls the switch 3 of the battery 2 and the voltage supply unit 20. The controller 40 includes an electronic circuit mainly composed of a known microcomputer including a CPU, a ROM and a RAM that constitute a storage unit, and an interface. The controller 40 is connected to a host electronic control unit (ECU) not depicted. In the controller 40, an external signal (drive signal) for turning on the switch 3 is output from the ECU, for example. In the storage unit, various reference voltages are stored. For example, in the storage unit, a normal reference voltage indicating the voltage in normal operation and an abnormal reference voltage indicating the voltage in abnormality detection operation are stored in advance. The normal reference voltage is defined by the above-described Expression 1, and the abnormal reference voltage is defined by the above-described Expression 2. In the storage unit, a short-circuit reference voltage indicating that the load portion R3 has short-circuited and an open-circuit reference voltage indicating that the load portion R3 has been open are further stored in advance. The short-circuit reference voltage is defined by the above-described Expression 3, and the open-circuit reference voltage is defined by the above-described Expression 4.

The controller 40 is connected to the voltage supply unit 20 and drives the voltage supply unit 20. The controller 40 outputs the drive signal (ON) to the voltage supply unit 20, for example, thereby applying the voltage V to the bridge circuit 10 from the voltage supply unit 20. Furthermore, the controller 40 outputs the drive signal (OFF) to the voltage supply unit 20, thereby halting the voltage V applied to the bridge circuit 10 from the voltage supply unit 20. The controller 40 is connected to the voltage detection unit 30, and the detection signal S (S1 to S4) is output from the voltage detection unit 30. The controller 40 is connected to the switch 3 and turns the switch 3 on or off based on the detection signal S (S1 to S4). The controller 40, when the detection signal S (S1 to S4) indicates an abnormality, outputs an abnormality detection signal and the like to the host ECU.

The controller 40 turns on the switch 3 to flow a current to the resistor R1, the resistor R2, the resistor R4, the resistor R5, and the load portion R3 from the battery 2 and supplies the electric power to the load portion R3 from the battery 2. The controller 40, when the electric power is supplied to the load portion R3 from the battery 2, compares the normal reference voltage that is stored in the storage unit with the detection signal S that is output from the voltage detection unit 30. Then, when determined that the detection signal S1 indicating the detection voltage Vdtc in normal operation is output from the voltage detection unit 30, the controller 40 determines that the electric power is normally supplied to the load portion R3 from the battery 2. The controller 40 then maintains the on-state of the switch 3. Furthermore, the controller 40 turns the switch 3 off, when determined that the detection signal S1 is not output from the voltage detection unit 30 and the electric power is not normally supplied to the load portion R3 from the battery 2. When the switch 3 is in the on-state and the detection voltage Vdtc in normal operation is 0 V, the controller 40 determines that the switch 3 has malfunctioned.

The controller 40 compares the abnormal reference voltage, the short-circuit reference voltage, and the open-circuit reference voltage that are stored in the storage unit with the detection signal S that is output from the voltage detection unit 30, when the voltage V is applied to the bridge circuit 10 from the voltage supply unit 20 before turning on the switch 3. Then, when determined that the detection signal S2 indicating the detection voltage Vdtc in the abnormality detection operation is output from the voltage detection unit 30, the controller 40 determines that the electrical connection of the load portion R3 is normal. The controller 40 then halts the voltage V applied to the bridge circuit 10 from the voltage supply unit 20 and turns on the switch 3.

In a case where it is determined that the detection signal S3 indicating the detection voltage Vdtc in short circuit detection is output from the voltage detection unit 30 when the voltage V is applied to the bridge circuit 10 from the voltage supply unit 20 before the switch 3 is turned on, the controller 40 determines that the load portion R3 has short-circuited. The controller 40 then halts the voltage V applied to the bridge circuit 10 from the voltage supply unit 20, maintains the off-state of the switch 3, and notifies a driver of a short circuit abnormality of the load portion R3. The controller 40 notifies of the short circuit abnormality by display, voice, or the like, for example.

In a case where it is determined that the detection signal S4 indicating the detection voltage Vdtc in open-circuit detection is output from the voltage detection unit 30 when the voltage V is applied to the bridge circuit 10 from the voltage supply unit 20 before turning on the switch 3, the controller 40 determines that the load portion R3 has been open. The controller 40 then halts the voltage V applied to the bridge circuit 10 from the voltage supply unit 20, maintains the off-state of the switch 3, and notifies the driver of an open circuit abnormality of the load portion R3. Note that, when the load portion R3 is open, the controller 40 may turn on the switch 3 to try whether the load portion R3 is electrically connected.

Figure 3:
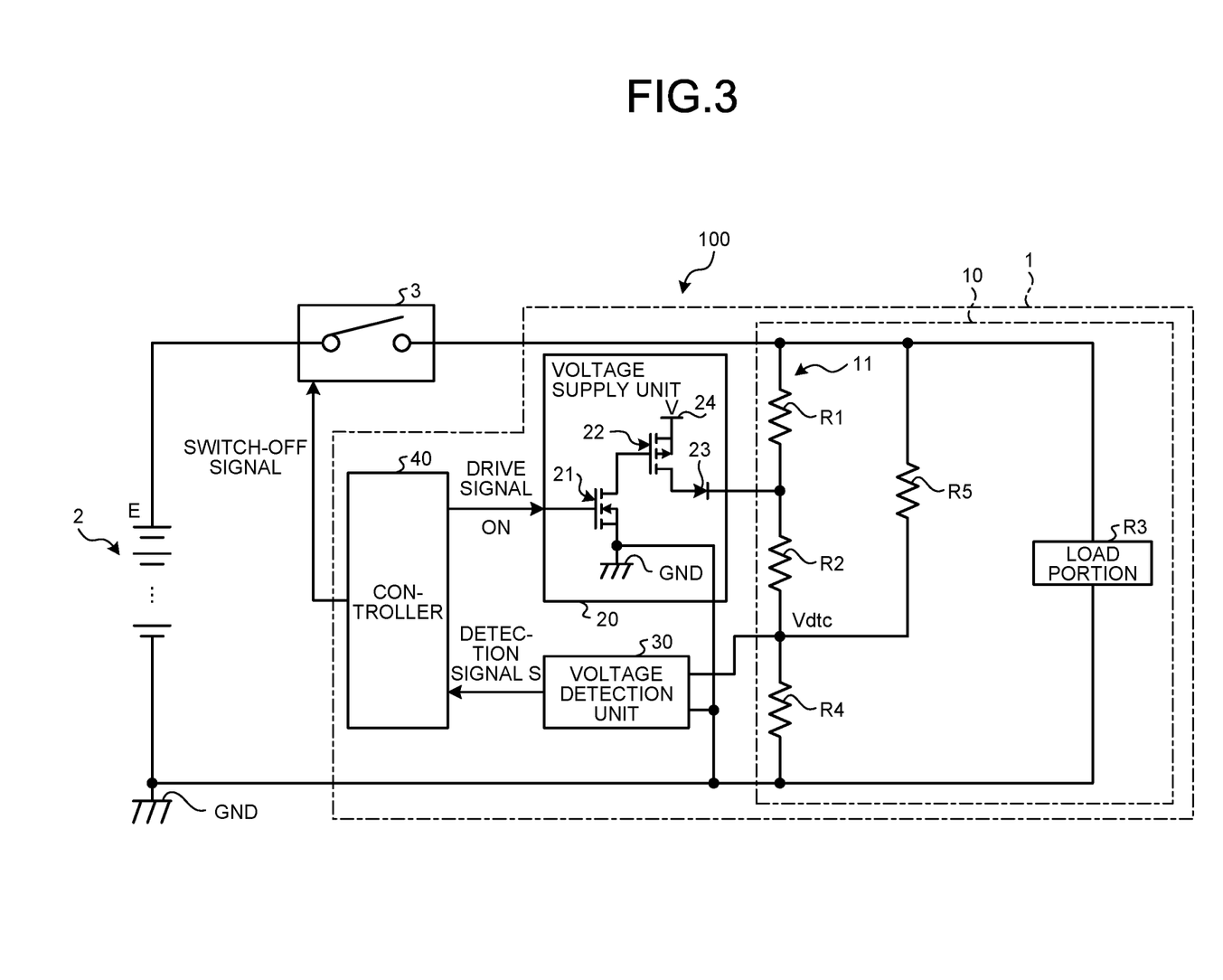
FIG. 3 is a circuit diagram illustrating the operation example of the abnormality detection device in the embodiment.
Figure 7:
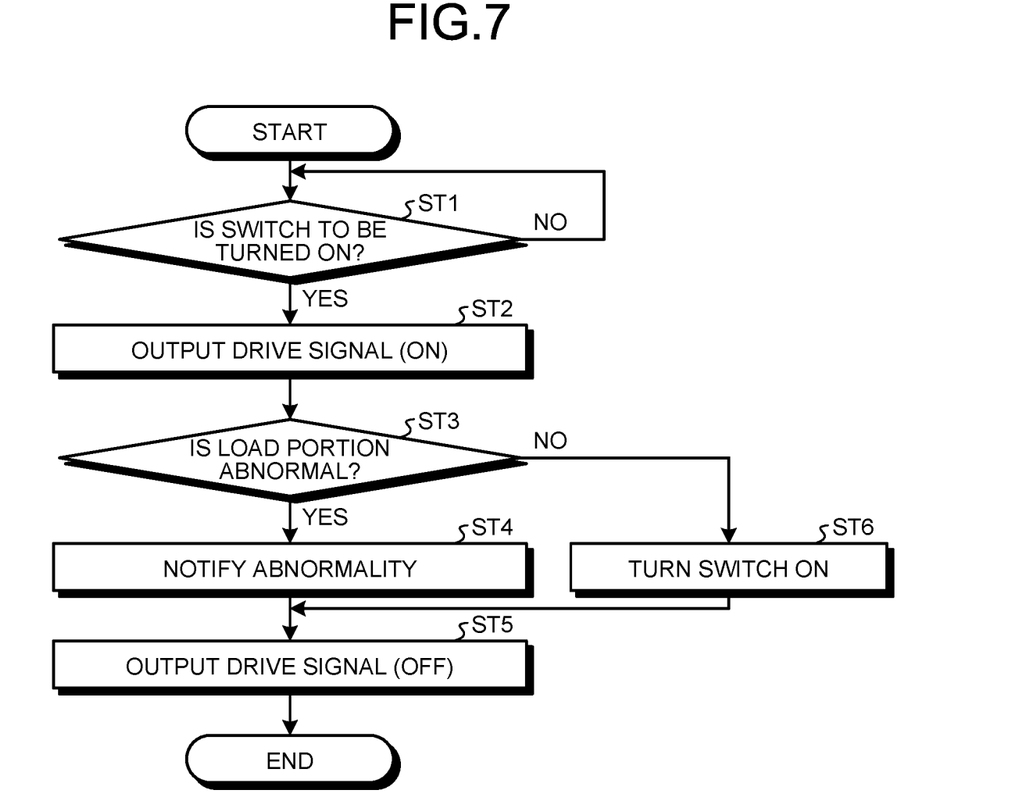
FIG. 7 is a flowchart illustrating an operation example of the abnormality detection device in the embodiment.

Next, with reference to FIG. 7, an operation example of the abnormality detection device 1 will be described. It is premised that the abnormality detection device 1 is in a state where the switch 3 is turned off and the electric power is not supplied to the load portion R3 from the battery 2. The controller 40 determines whether an external signal for turning on the switch 3 is output (Step ST1). In the controller 40, the external signal for turning on the switch 3 is output from the host ECU, when an ignition power supply of the vehicle is turned on, for example. When the external signal for turning on the switch 3 is output (Yes at Step ST1), the controller 40, as illustrated in FIG. 3, outputs the drive signal (ON) to the voltage supply unit 20 (Step ST2). In the voltage supply unit 20, when the drive signal (ON) is output from the controller 40, the FETs 21 and 22 are turned on to apply the voltage V to the bridge circuit 10. When the voltage V is applied to the bridge circuit 10, the voltage detection unit 30 outputs any one of the detection signals S2 to S4 to the controller 40. The controller 40 determines that the load portion R3 is electrically abnormal when the detection signal S3 or S4 is output (Yes at Step ST3). The controller 40 determines that, when the detection signal S3 is output, for example, the load portion R3 has short-circuited and the short circuit abnormality is notified by display, voice, or the like (Step ST4). Furthermore, the controller 40 determines that, when the detection signal S4 is output, for example, the load portion R3 has been open and the open-circuit abnormality is notified by display, voice, or the like (Step ST4). Then, the controller 40 outputs the drive signal (OFF) to the voltage supply unit 20 (Step ST5) as illustrated in FIG. 2 to halt the voltage V applied to the bridge circuit 10 from the voltage supply unit 20, and ends the processing in a state where the switch 3 is off. At the above-described Step ST1, when the external signal for turning on the switch 3 is not output (No at Step ST1), the controller 40 waits until the external signal for turning on the switch 3 is output. At the above-described Step ST3, when the detection signal S2 is output, the controller 40 determines that the load portion R3 is electrically normal (No at Step ST3), and turns on the switch 3 (Step ST6).

As in the foregoing, the abnormality detection device 1 according to the embodiment includes the bridge circuit 10, the voltage supply unit 20, and the controller 40. The load portion R3 is connected to the battery 2 and is supplied with the electric power from the relevant battery 2. The load portion R3 is an abnormality detection target. The bridge circuit 10 includes the resistor R1, the resistor R2, the load portion R3 that is the third resistor, the resistor R4, and the resistor R5. The voltage supply unit 20 is a power source different from the battery 2 and applies the voltage V to the bridge circuit 10. The controller 40 controls the switch 3 and the voltage supply unit 20. In the bridge circuit 10, a series circuit 11 in which the resistor R1 and the resistor R2 are connected in series and the resistor R2 and the resistor R4 are connected in series is formed. In the bridge circuit 10, the series circuit 11 is connected to the load portion R3 in parallel, one end of the resistor R5 is connected between the resistor R2 and the resistor R4, and the other end of the resistor R5 is connected between the resistor R1 and the load portion R3. Furthermore, in the bridge circuit 10, the voltage supply unit 20 is connected between the resistor R1 and the resistor R2. The controller 40 detects the abnormality of the load portion R3 on the basis of the detection voltage Vdtc of the bridge circuit 10 detected by applying the voltage V from the voltage supply unit 20 in a state where the switch 3 is turned off.

With this configuration, the abnormality detection device 1 can detect the detection voltage Vdtc of the battery 2 by the resistor R1, the resistor R2, the resistor R4, the resistor R5, and the voltage detection unit 30. Furthermore, the abnormality detection device 1 can detect the abnormality of the load portion R3, by the bridge circuit 10 including the resistor R1, the resistor R2, the load portion R3, the resistor R4, and the resistor R5, the voltage detection unit 30, and the voltage supply unit 20. With this configuration, the abnormality detection device 1 can perform both the voltage detection of the battery 2 and the abnormality detection of the load portion R3, by using the circuit in common (the resistor R1, the resistor R2, the resistor R4, the resistor R5, and the voltage detection unit 30). With this configuration, the abnormality detection device 1 can, by appropriating the circuit for voltage detection of the battery 2, perform the abnormality detection in the electrical connection of the load portion R3, and thus the electronic components can be reduced. As a result, the abnormality detection device 1 can reduce the space for installing the electronic components and can suppress an increase in the size of the device. Furthermore, because the abnormality detection device 1 can reduce the electronic components, the manufacturing cost can be suppressed. Moreover, the abnormality detection device 1 can safely perform the power supply, by performing a circuit check immediately before turning on the switch 3, or at the time of restart from disconnection after detecting an abnormality and disconnecting the connection between the battery 2 and the load portion R3.

In the above-described abnormality detection device 1, the controller 40 detects a short circuit of the load portion R3 on the basis of the short-circuit reference voltage indicating that the load portion R3 has short-circuited and the detection voltage Vdtc, and detects an open circuit of the load portion R3 on the basis of the open-circuit reference voltage indicating that the load portion R3 has been open and the detection voltage Vdtc. With this configuration, the abnormality detection device 1 compares the detection voltage Vdtc with the short-circuit reference voltage and, when the detection voltage Vdtc matches the short-circuit reference voltage, determines that the load portion R3 has short-circuited. Furthermore, the abnormality detection device 1 compares the detection voltage Vdtc with the open-circuit reference voltage and, when the detection voltage Vdtc matches the open-circuit reference voltage, determines that the load portion R3 has been open.

Modification

Figure 8:
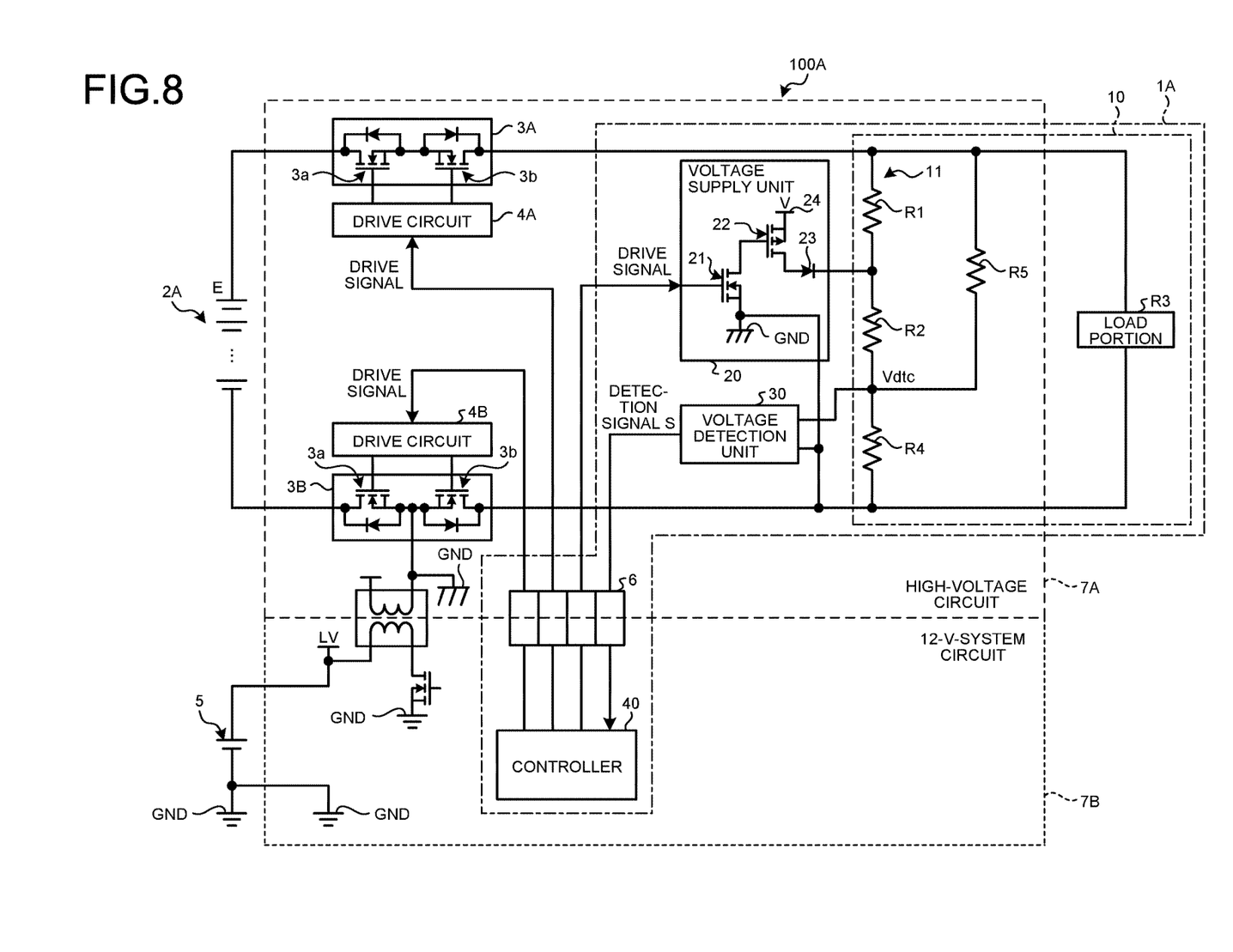
FIG. 8 is a circuit diagram illustrating an example of application to a high-voltage J/B in the embodiment.

Next, a modification of the embodiment will be described. An abnormality detection device 1A according to the modification is incorporated in a semiconductor high-voltage J/B of a high-voltage vehicle as a vehicle-power supply control system 100A. In the modification, the constituent elements equivalent to those in the embodiment are denoted by the same reference signs and detailed description thereof is omitted. The vehicle-power supply control system 100A, as illustrated in FIG. 8, includes a high-voltage circuit 7A and a 12-V-system circuit 7B. The high-voltage circuit 7A and the 12-V-system circuit 7B are insulated. The high-voltage circuit 7A includes a high-voltage battery 2A, the load portion R3, the constituent elements of the abnormality detection device 1A except for the controller 40, an upstream semiconductor relay 3A that is provided on the upstream side of the load portion R3, a drive circuit 4A that drives the upstream semiconductor relay 3A, a downstream semiconductor relay 3B that is provided on the downstream side of the load portion R3, and a drive circuit 4B that drives the downstream semiconductor relay 3B. The 12-V-system circuit 7B includes the controller 40 and a 12-V-system battery 5.

The upstream semiconductor relay 3A and the downstream semiconductor relay 3B have each a pair of FETs 3a and 3b, and source terminals of the respective FETs 3a and 3b are connected. The abnormality detection device 1A includes the bridge circuit 10, the voltage supply unit 20, the voltage detection unit 30, and the controller 40. The controller 40 is connected to the voltage supply unit 20, the voltage detection unit 30, and the drive circuits 4A and 4B via an insulation element 6. In the controller 40, the detection signal S is output from the voltage detection unit 30. Furthermore, the controller 40 outputs drive signals to the voltage supply unit 20 and the drive circuits 4A and 4B. The 12-V-system battery 5 is an insulated power source, is insulated and connected to the downstream semiconductor relay 3B, and supplies electric power to the downstream semiconductor relay 3B. The abnormality detection device 1A performs abnormality detection operation in a state where the upstream semiconductor relay 3A is turned off and the downstream semiconductor relay 3B is turned on, for example.

As in the foregoing, the abnormality detection device 1A can be applied to a semiconductor high-voltage J/B of a high-voltage vehicle. The abnormality detection device 1A can perform both the voltage detection of the high-voltage battery 2A and the abnormality detection of the load portion R3, by using the circuit in common (the resistor R1, the resistor R2, the resistor R4, the resistor R5, and the voltage detection unit 30), and thus the electronic components can be reduced, and an increase in the size of the device can be suppressed. When applied to the semiconductor high-voltage J/B of the high-voltage vehicle, the abnormality detection device 1A needs to use a resistor for voltage detection considering a withstanding voltage of the high voltage and the like. However, because the resistors (the resistor R1, the resistor R2, the resistor R4) used for the voltage detection of the high-voltage battery 2A are used, the circuit for the abnormality detection can be configured easily.

While the controller 40 and the voltage detection unit 30 are assumed to be separate functional blocks, the controller 40 and the voltage detection unit 30 may be assumed as a single functional block.

The abnormality detection device according to the embodiment includes the bridge circuit in which the series circuit composed of the first resistor, the second resistor, and the fourth resistor is connected to the third resistor in parallel, in which one end of the fifth resistor is connected between the second resistor and the fourth resistor and the other end of the fifth resistor is connected between the first resistor and the third resistor, and in which the voltage supply unit is connected between the first resistor and the second resistor. The third resistor is connected to the main power source and is supplied with electric power from the main power source. The abnormality detection device detects the abnormality of the third resistor on the basis of the detection voltage of the bridge circuit detected by applying the voltage from the voltage supply unit in a state where the main power source is turned off. With this configuration, the abnormality detection device can perform both the voltage detection of the main power source and the abnormality detection of the third resistor, by using the circuit in common (the first resistor, the second resistor, the fourth resistor, the fifth resistor, and the controller). As a result, the abnormality detection device can suppress an increase in size.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An abnormality detection device comprising:
   an abnormality detection target connected to a main power source and is supplied with electric power from the main power source;
   a bridge circuit including a first resistor, a second resistor, a third resistor that is the abnormality detection target, a fourth resistor, and a fifth resistor;
   a voltage supply unit being a power source different from the main power source and configured to apply a voltage to the bridge circuit; and
   a controller configured to control the main power source and the voltage supply unit, wherein
   in the bridge circuit, a series circuit in which the first resistor and the second resistor are connected in series and in which the second resistor and the fourth resistor are connected in series is formed, the series circuit is connected to the third resistor in parallel, one end of the fifth resistor is connected between the second resistor and the fourth resistor, and the other end of the fifth resistor is connected between the first resistor and the third resistor, and the voltage supply unit is connected between the first resistor and the second resistor, and
   the controller is configured to detect an abnormality of the third resistor on a basis of a detection voltage of the bridge circuit detected by applying the voltage from the voltage supply unit in a state where the main power source is turned off.

2. The abnormality detection device according to claim 1, wherein
   the controller is configured to
      detect a short circuit of the third resistor on a basis of the detection voltage and a short-circuit reference voltage indicating that the third resistor has short-circuited, and detect an open circuit of the third resistor on a basis of the detection voltage and an open-circuit reference voltage indicating that the third resistor has been open.

\* \* \* \* \*